US008258801B2

(12) United States Patent  
Kuekes (10) Patent No.: US 8,258,801 B2
(45) Date of Patent: Sep. 4, 2012

(54) NANOSCALE MULTIPLEXER (75) Inventor: Philip J. Kuekes, Menlo Park, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 527 days.

(21) Appl. No.: 12/380,910

(22) Filed: Mar. 5, 2009

(65) Prior Publication Data

US 2011/0181307 A1    Jul. 28, 2011

(51) Int. Cl.
*G01R 11/32* (2006.01)
*H01L 29/04* (2006.01)

(52) U.S. Cl. .............. 324/722; 324/134; 257/3
(58) Field of Classification Search ............ 324/722, 324/134; 257/3
See application file for complete search history.

(56) References Cited

U.S. PATENT DOCUMENTS

| | | | |
|---|---|---|---|
| 6,128,214 A | 10/2000 | Kuekes et al. | |
| 6,256,767 B1 | 7/2001 | Kuekes et al. | |
| 6,314,019 B1 | 11/2001 | Kuekes et al. | |
| 6,459,095 B1 | 10/2002 | Heath et al. | |
| 2005/0091624 A1* | 4/2005 | Baugh et al. | 716/8 |
| 2006/0238223 A1* | 10/2006 | Kuekes et al. | 326/134 |

* cited by examiner

*Primary Examiner* — Melissa Koval
*Assistant Examiner* — Farhana Hoque (57) ABSTRACT

In one embodiment of the present invention, a microscale or sub-microscale signal line, interconnected with one set of parallel nanowires of a nanowire crossbar, serves as a multiplexer. The multiplexer is used to detect the conductivity state of a nanowire junction within the nanowire crossbar. In one method embodiment of the present invention, a first signal is output to the two nanowires interconnected by the nanowire junction, while a second signal is output to the remaining nanowires of the nanowire crossbar. Then, the second signal is output to the two nanowires interconnected by the nanowire junction, while the first signal is output to the remaining nanowires of the nanowire crossbar. The resulting signal detected on the multiplexer is reflective of the conductivity state of the nanowire junction.

18 Claims, 14 Drawing Sheets

NANOSCALE MULTIPLEXER

TECHNICAL FIELD

The present invention relates to molecular electronics and, in particular, to a multiplexer that allows for accessing individual nanowire junction in a nanowire crossbar.

BACKGROUND OF THE INVENTION

The parallel demands for more dense and cost-effective electronic memories, and for ever faster computer processors, have inspired enormous scientific and technological advances over the past 50 years. Expensive, unreliable, and voluminous vacuum-tube-based computational systems were replaced by transistor-based computational systems, in turn replaced by integrated-circuit-based computational systems of ever decreasing feature dimensions and ever increasing densities and switching speeds. As certain fundamental physical limits to further decreasing the feature dimensions of integrated circuits produced by photolithographic methods have begun to be approached, significant research and development efforts have been applied to newer, molecular-electronics-based logic circuits and, ultimately, molecular-electronics-based processors, memories, and integrated computational systems.

Molecular electronics provide a significant leap with respect to feature dimensions and electronic component densities, but also present new and challenging problems. Recently, for example, nanowire-crossbar memories have been developed for storing information in nanowire junction at the nanowire intersections of a grid-like nanowire crossbar. Techniques have been developed for addressing a particular nanowire junction and for changing the state of the nanowire junction repeatedly between two different and electronically detectable conductivity states. However, nanowire-crossbar-memory designers and manufacturers have recognized the need for a method and device to allow for accessing an individual nanowire junction within a nanowire-crossbar memory in order to determine which of two conductivity states the nanowire junction currently inhabits. In other words, while the nanowire-crossbar memories, and methods for writing information to the nanowire-crossbar memories, have been developed, manufacturers and designers of nanowire-crossbar memories continue to seek a method and implementation for reading the contents of nanowire-crossbar memories that can be economically, reliably, and feasibly manufactured.

SUMMARY OF THE INVENTION

In one embodiment of the present invention, a microscale or sub-microscale signal line, interconnected with one set of parallel nanowires of a nanowire crossbar, serves as a multiplexer. The multiplexer is used to detect the conductivity state of a nanowire junction within the nanowire crossbar. In one method embodiment of the present invention, a first signal is output to the two nanowires interconnected by the nanowire junction, while a second signal is output to the remaining nanowires of the nanowire crossbar. Then, the second signal is output to the two nanowires interconnected by the nanowire junction, while the first signal is output to the remaining nanowires of the nanowire crossbar. The resulting signal detected on the multiplexer is reflective of the conductivity state of the nanowire junction.

DETAILED DESCRIPTION OF THE INVENTION

Figure 1:
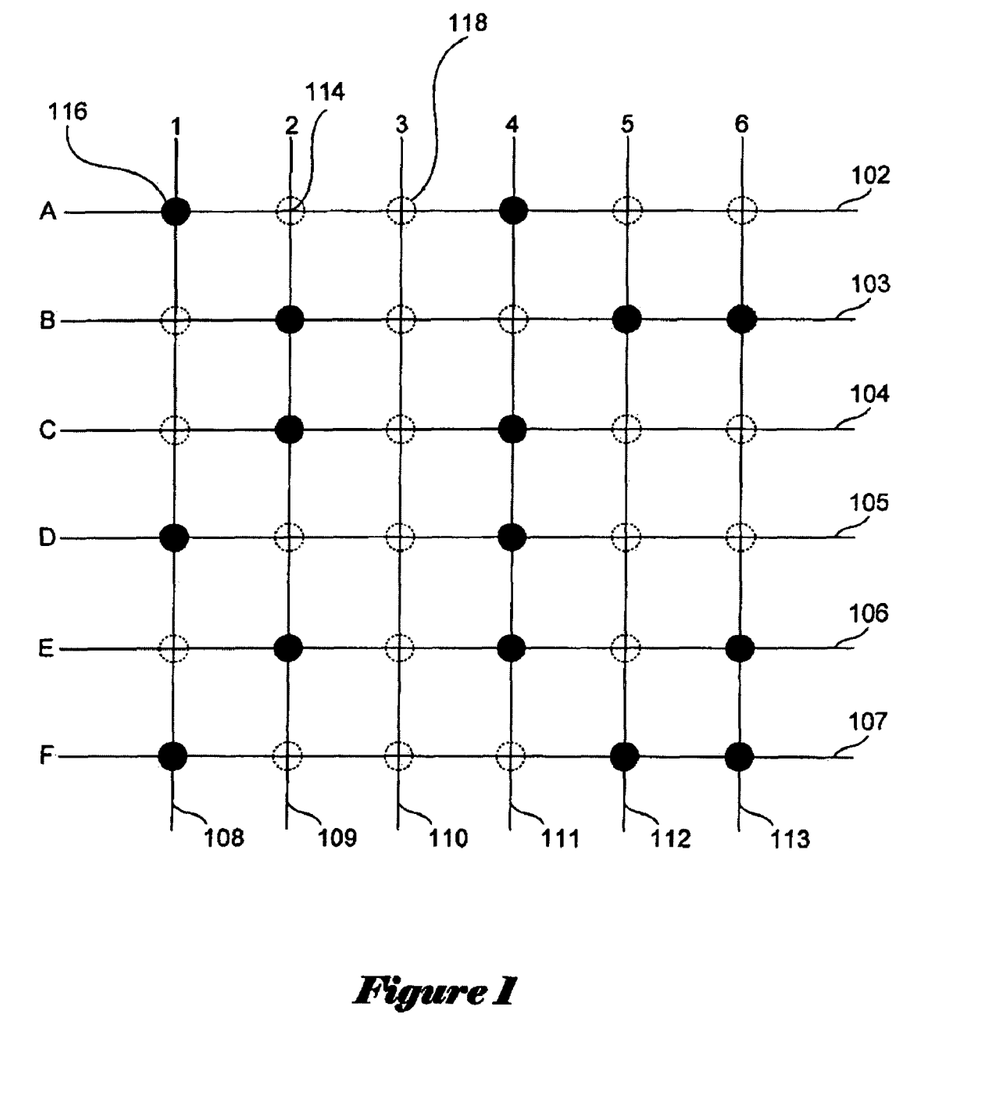
FIG. 1 illustrates a nanowire-crossbar memory.

FIG. 1 illustrates a nanowire-crossbar memory. In FIG. 1, a first set of approximately parallel nanowires 102-107 overlie a second set of approximately parallel nanowires 108-113, the second set of nanowires roughly perpendicular to the first set of nanowires. In a nanowire-crossbar memory, each intersection between a nanowire of the first set of parallel nanowires and a nanowire of the second set of parallel nanowires, such as intersection 114, may represent a single bit of information. The single bit of information is physically represented by the conductivity state of the nanowire junction interconnecting the two nanowires at the nanowire-intersection point. As shown in FIG. 1, certain of the memory elements, or nanowire intersections, may be in a closed state, represented in FIG. 1 by a filled disk, such as filled disk 116, and other memory elements may be in an open state, represented in FIG. 1 by a circular, dashed line, such as circular dashed line 118. The terms "open" and "closed" refer to the state of a simple electrical switch that conducts electricity when closed, and that prevents current flow when open. An open nanowire junction refers to a relatively high-resistance state, in which current flow through the nanowire junction is inhibited, and a closed nanowire junction refers to a relatively low resistance state, in which current flow through the nanowire junction may occur. Of course, a closed nanowire junction can also be considered to be in a state in which voltage does not drop by a large amount across the nanowire junction, while a significant voltage drop occurs across an open nanowire junction. Although only six horizontal and vertical nanowires are shown in the nanowire crossbar of FIG. 1, nanowire-crossbar memories may consist of hundreds, thousands, or millions or more of interconnected nanowire crossbars, each nanowire crossbar having tens, hundreds, or more of parallel nanowires in each of the two sets of parallel nanowires that together compose the nanowire crossbar.

FIGS. 2A-D illustrate writing a bit of information to a memory element within a nanowire-crossbar memory. FIGS. 2A-D employ the same illustration conventions as employed in FIG. 1. For convenience of reference, the first set of parallel nanowires 102-107, referred to as "horizontal nanowires," is labeled with capital letters "A" through "F." The second set of parallel nanowires 108-113, referred to as "vertical nanowires," is labeled with the numbers "1" through "6." A particular nanowire intersection within the nanowire crossbar is referred to by the letter of the horizontal nanowire and number of the vertical nanowire that intersect at the intersection. For example, the nanowire intersection 202 is referred to as intersection "B2." In the current figures and subsequent figures, nanowire intersection, or memory element, "B2" is selected as an example intersection to illustrate electronic access of nanowire-crossbar memory elements.

Figure 2A:
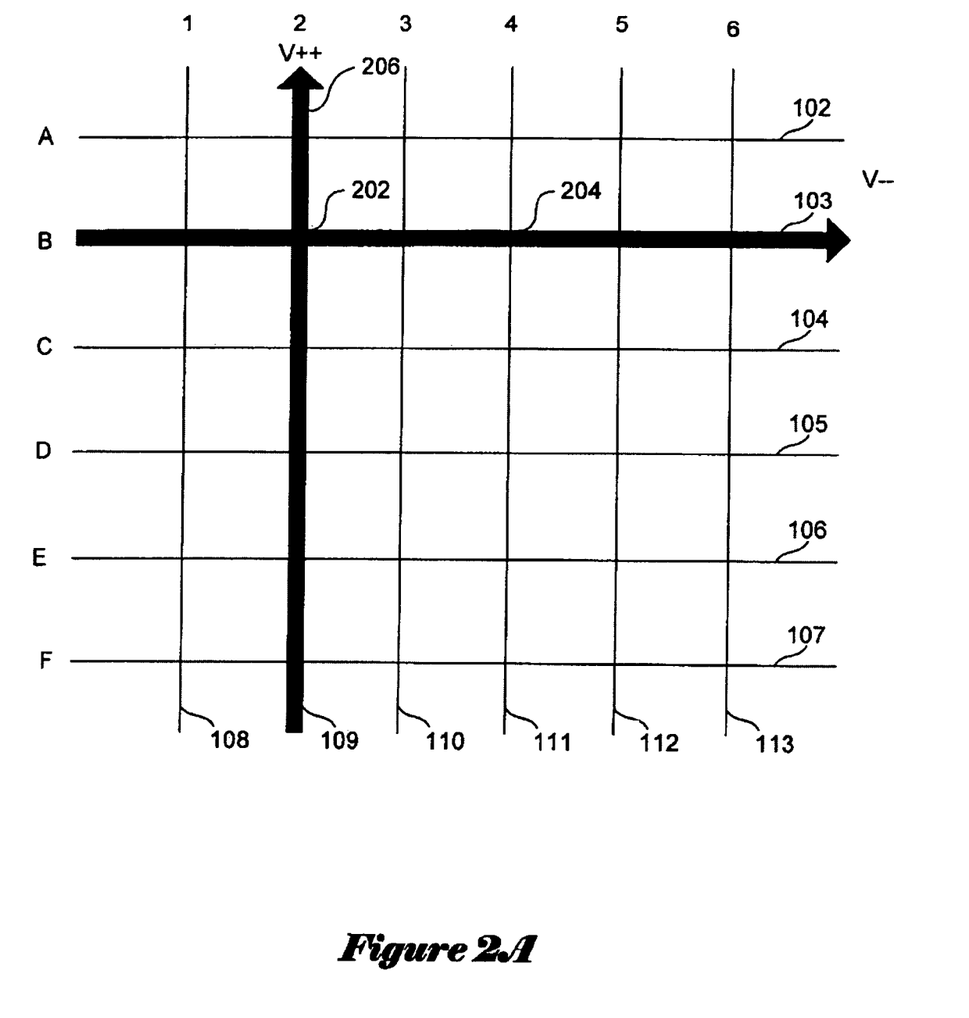
FIGS. 2A-D illustrate writing a bit of information to a memory element within a nanowire-crossbar memory.
Figure 2B:
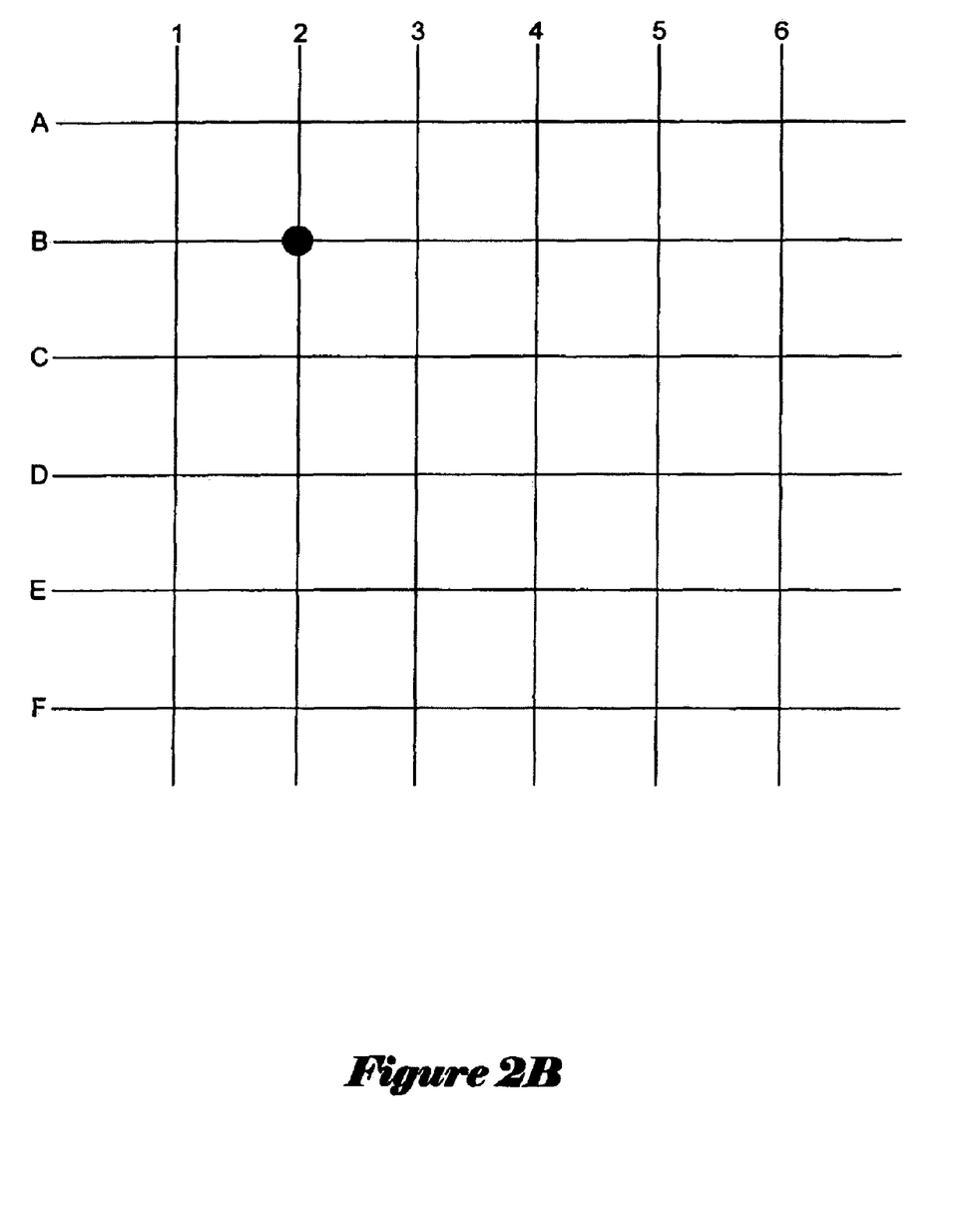
Figure 2C:
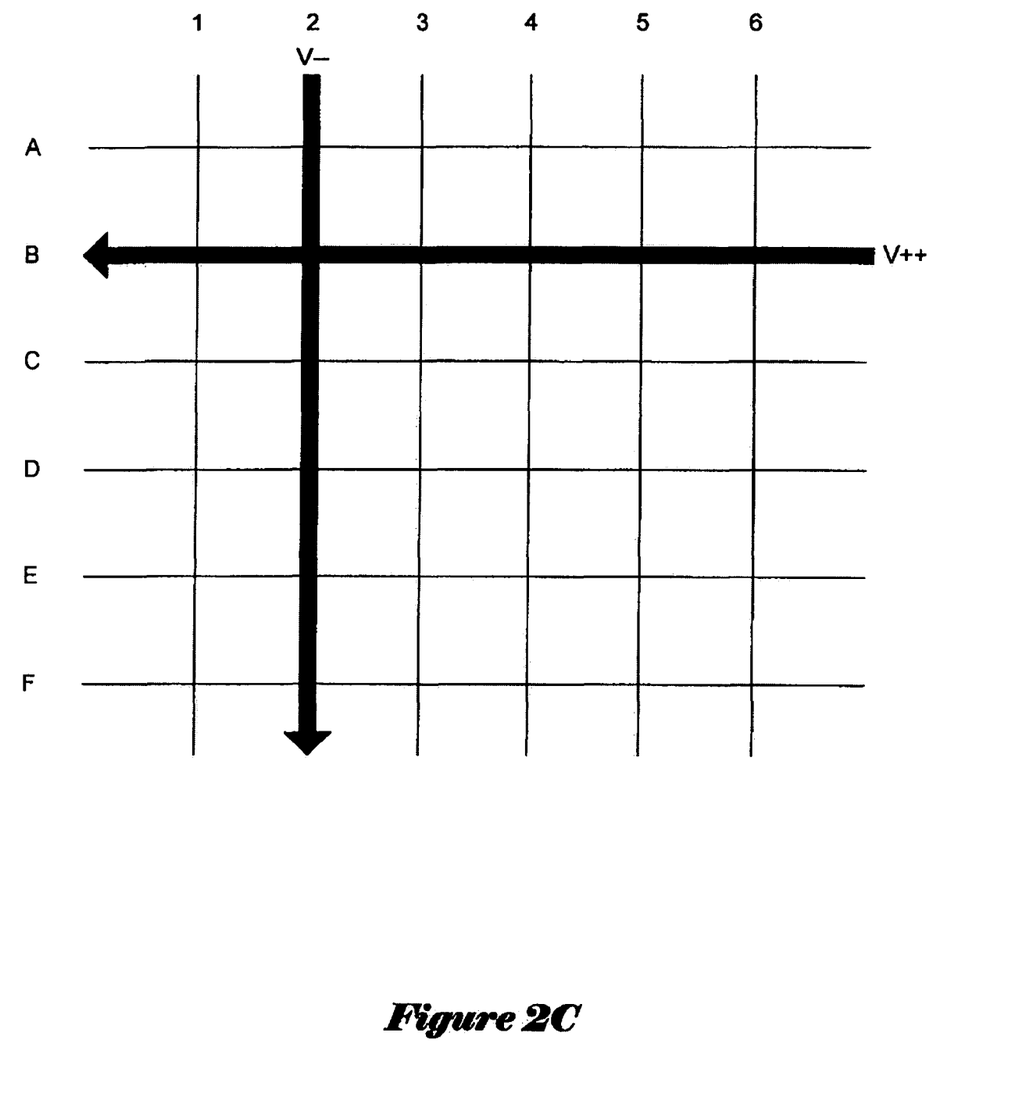

In FIG. 2A, a large-magnitude, negative voltage $V_{--}$ is applied to horizontal nanowire "B" and a large-magnitude, positive voltage $V_{++}$ is applied to vertical nanowire "2," indicated in FIG. 2A by the arrows 204 and 206, respectively. Application of a large voltage differential to both nanowires produces, at their intersection, a large flow of current through the nanowire junction interconnecting the two nanowires and a physical/chemical modification of the nanowire junction, resulting in a low-resistance, or closed state, as indicated by the filled disk symbol at intersection "B2" in FIG. 2B. When a large voltage differential is applied to both nanowires in an opposite direction, as shown in FIG. 2C, the state of the nanowire junction at intersection "B2" reverts to an open state, as shown by the dashed circle at intersection "B2" in FIG. 2D.

Figure 2D:
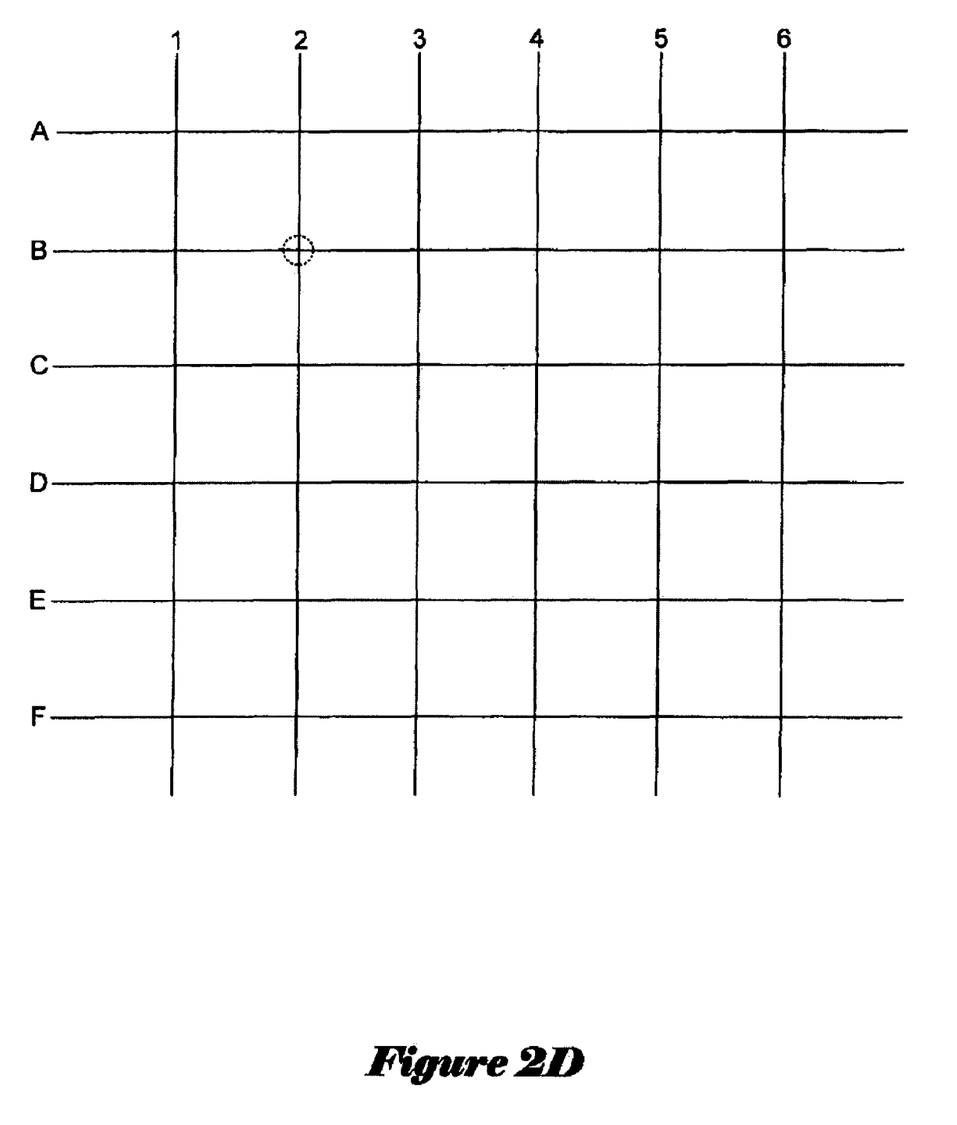

In one type of nanowire crossbar memory, the open state of a nanowire junction, as shown in FIG. 2D, essentially isolates the overlapping, or intersecting, nanowires from one another because the nanowire junction is in a high-resistance state. By contrast, when the nanowire junction is in a closed state, as shown in FIG. 2B, the nanowire junction acts as a diode, passing current between the two nanowires in one direction only. Thus, again, an open state, produced by application of a very high voltage differential in one direction to both nanowires of a nanowire junction, represents electrical isolation of the two nanowires from one another at the nanowire junction, while a closed state, produced by application of a very high voltage differential in an opposite direction, interconnects the two nanowires through a diode-like nanowire junction that passes current in a single direction.

Figure 3:
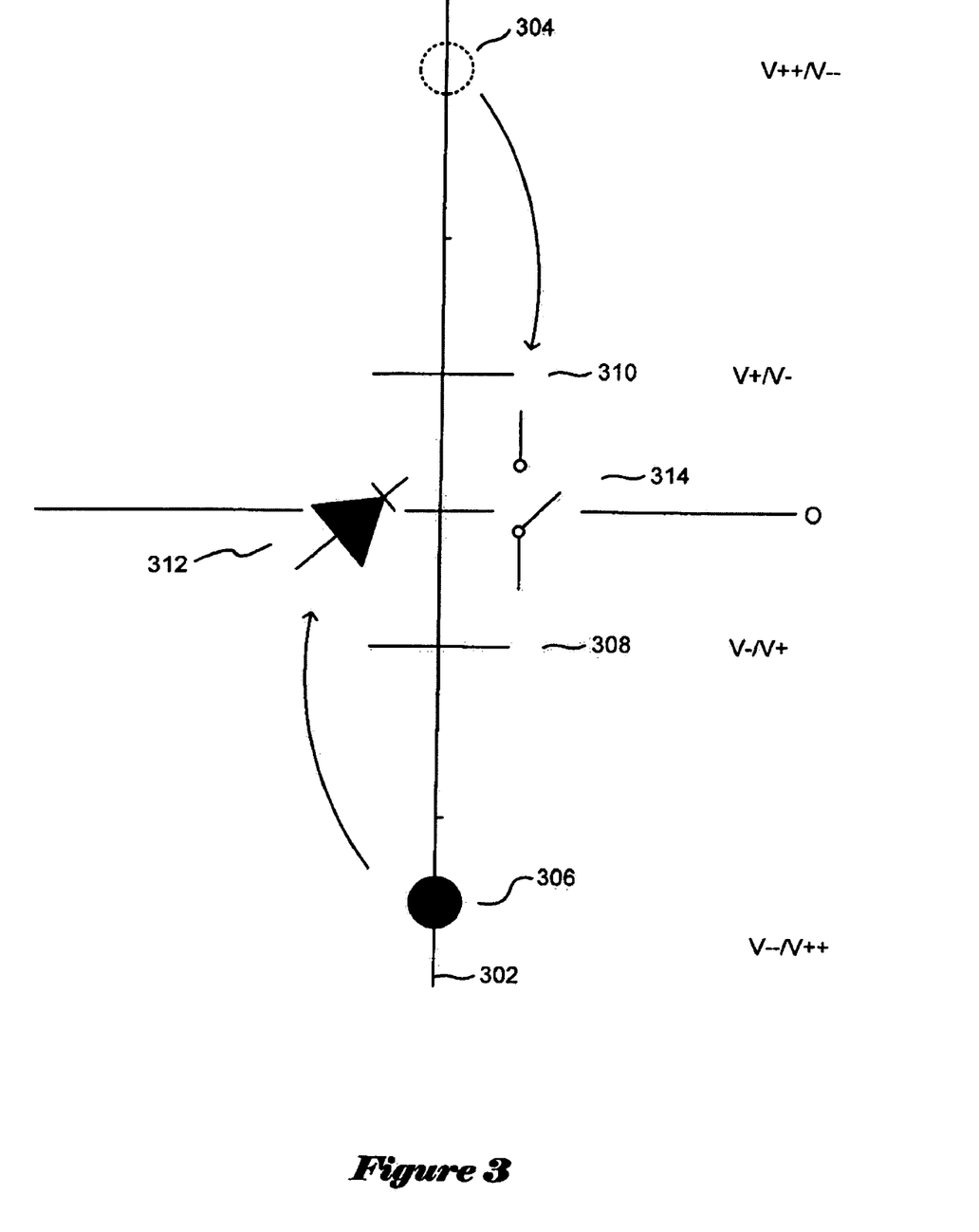
FIG. 3 schematically illustrates the two states of a nanowire-crossbar memory.

FIG. 3 schematically illustrates the two states of a nanowire-crossbar memory. In FIG. 3, the possible states of a nanowire junction within a nanowire crossbar are shown with respect to a vertical axis 302 representing the voltage differential applied to the nanowires that intersect at the nanowire junction. As shown in FIG. 3, when a relatively high voltage differential $V_{++}/V_{--}$ is applied to the nanowires, the nanowire junction is placed into a high-resistance open state 304. Conversely, when a relatively high voltage differential $V_{--}/V_{++}$ is applied to the nanowires in an opposite direction, the nanowire junction is placed into a conductive, diode-like state 306. In a range of intermediate voltage differentials between the negative voltage differential $V_-/V_+$ 308 and the positive voltage differential $V_+/V_-$ 310, the nanowire junction may act either as a diode 312, providing that the last large voltage differential applied to the nanowire junction was $V_{--}/V_{++}$, or as an open switch 314, providing that the last large voltage differential applied to the nanowire junction was $V_{++}/V_{--}$. The relatively low-magnitude-voltage differential range between differential 308 and differential 310 can therefore be used to read the state of a nanowire junction without altering that state by detecting whether the nanowire junction is currently acting as a diode or as an open switch.

Figure 4:
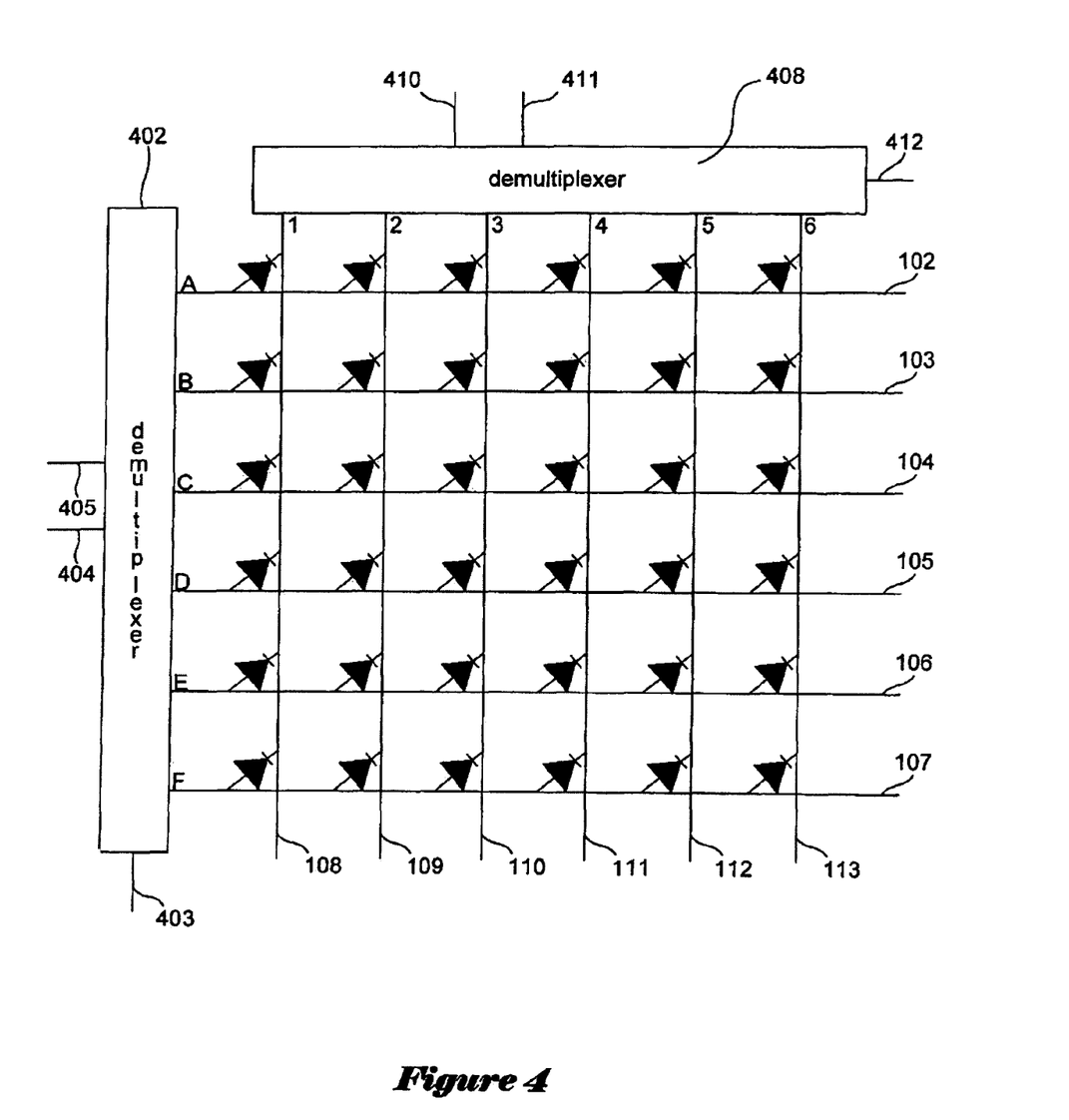
FIG. 4 shows two demultiplexers added to the nanowire-crossbar memory, discussed with reference to FIGS. 1-3, in order to provide for input of digitally-encoded values into the nanowire-crossbar memory.

In order to implement a working nanowire-crossbar memory, a means must be developed for creating large positive voltages, $V_{++}$ and large negative voltages $V_{--}$ at selected nanowire junctions within a nanowire crossbar in order to write information into the nanowire crossbar as binary values. Either the open or closed state, described above with reference to FIGS. 1-3, may be chosen to represent binary digit "1," and the other of the two states therefore representing binary digit "0." Individual nanowire junctions may be accessed for input of data, in one embodiment, using a pair of orthogonally disposed demultiplexers. FIG. 4 shows two demultiplexers added to the nanowire-crossbar memory discussed above with reference to FIGS. 1-3 in order to provide for input of digitally-encoded values into the nanowire-crossbar memory. In FIG. 4, a first, vertically oriented demultiplexer 402 is controlled by input signal and voltage potential lines 403-405 to output one of voltages $V_{++}, V_+, V_-,$ and $V_{--}$ concurrently to each of the horizontal nanowires 102-107. A horizontally disposed, second demultiplexer 408 is controlled by input signal lines and voltage lines 410-412 to output one of the voltages $V_{++}, V_+, V_-,$ and $V_{--}$ to each of the vertical nanowires 108-113. In a convention where an open state of a nanowire junction represents the binary value "1," the binary value "1" can be written to the nanowire-crossbar memory by outputting voltage $V_{++}$ from demultiplexer 402 to horizontal nanowire 103 and voltage $V_{--}$ from demultiplexer 412 to vertical nanowire 109. The combined voltage differential at the nanowire junction "B2" then provides a sufficient, positive voltage drop to switch the state of, the nanowire junction at intersection "B2" to the open, high-resistance state. By contrast, if voltage $V_{--}$ is applied by demultiplexer 402 to horizontal signal line 103 and voltage $V_{++}$ is applied to vertical nanowire 109 from demultiplexer 408, then the nanowire junction at intersection "B2" is transformed to a closed state. Note that, as shown in FIG. 4, each nanowire junction at each nanowire intersection acts as a diode, passing current in only one direction. The direction of current transmission and the sign of the applied voltages needed to place a particular nanowire junction in a closed or open state depend on the chemical characteristics of the nanowire junction, and may differ from material to material.

Working implementations of the nanowire-crossbar memory illustrated in FIG. 4 have been prepared from a variety of different materials and fabrication processes. However, while they can be painstakingly tested to insure that the nanowire junctions can be reliably and at least semi-permanently switched from closed states to open states and from open states to closed states, implementers have sought an economical and feasible method for accessing the nanowire-crossbar memory in order to determine the information currently stored within the nanowire-crossbar memory. In other words, while the two, orthogonally dispositioned demultiplexers provided a means for writing information into the nanowire-crossbar memory, they do not provide a method for read access to individual nanowire junction within the nanowire-crossbar memory. In testing environments, delicate nanowire probes may be used to access individual nanowire junctions, but such testing methods are not suitable and not feasible for employment in manufactured nanowire-crossbar memories.

Figure 5:
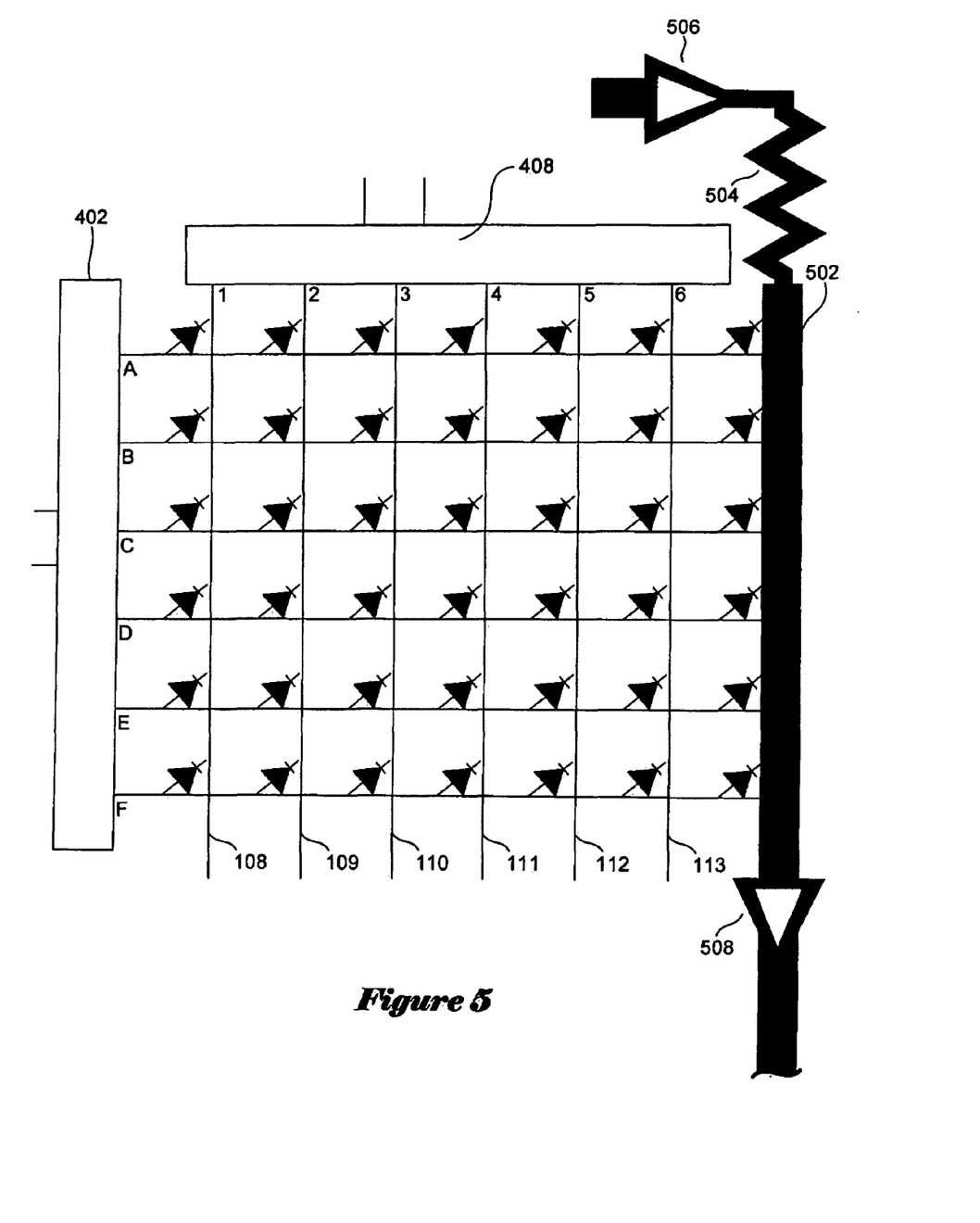
FIG. 5 illustrates a nanowire-crossbar multiplexer that represents one embodiment of the present invention.

FIG. 5 illustrates a nanowire-crossbar multiplexer that represents one embodiment of the present invention. FIG. 5 shows the two orthogonally disposed demultiplexers 402 and 408 and the nanowire-crossbar shown in FIG. 4. In addition, a microscale, or sub-microscale, signal line 502 is interconnected with the horizontal nanowires 102-107 through diode nanowire/microscale-wire junctions. The multiplexer wire 502 is interconnected through a fixed resistance 504 to a controllable voltage source 506 that is held at an appropriate voltage for each different READ and WRITE access operation. A signal amplifier 508 is interconnected with the multiplexer wire at the end of the multiplexer wire opposite from the end interconnected with system ground. The multiplexer wire 502 is either in a relative low-voltage state, at or above system ground, or, alternatively, may be placed into a moderately high-voltage state if a moderately high voltage is transmitted to the multiplexer wire through any one or more of the horizontal nanowires from the vertical demultiplexer 402. The moderately high voltage $V_+$ is greater than a voltage level that can be absorbed by the resister sink 504, and therefore results in a detectable, moderately high voltage state of the multiplexer wire 502 detectably different from the low-voltage state. The signal amplifier 508 can be employed to magnify the voltage difference between the low voltage and moderately high-voltage states of the multiplexer wire in order to generate two well-separated voltage states that can be employed in microelectronic circuitry downstream from the signal amplifier. The multiplexer wire 502 does not need to be precisely aligned to nanoscale components. Therefore, the multiplexer wire is relatively easily, cheaply, and reliably manufactured with current microscale or sub-microscale fabrication techniques.

Interconnection of the nanowires with the multiplexer wire may be through diode-like, switch-like, or more complex, non-linear nanowire/microscale-wire junctions. Diode-like, switch-like, or more complex, non-linear nanowire junctions are needed to prevent voltage return from the multiplexer wire to nanowires that are not involved in selection of a particular nanowire junction. The nanowire/microscale-wire junctions may be essentially the same as the diode nanowire junctions of the crossbar, or may be different from them. The voltage source 506 is carefully controlled to prevent excessive voltage drops across the diode-like, switch-like, or more complex, non-linear nanowire/microscale-wire junctions, especially during nanowire-junction WRITE operations that change the logic state of nanowire-junctions. For example, application of a negative voltage drop sufficiently large to open a nanowire junction could also open a diode connection to the multiplexer wire, thereby preventing subsequent READ operations directed to nanowire-junctions along the nanowire isolated from the multiplexer wire by the open connection. By controlling the voltage source 506 output, the voltage drop across diode-like interconnections to the multiplexer wire can be controlled to initially set the diode-like interconnection to a closed state, and maintain the diode-like interconnection in a closed state during subsequent READ and WRITE operations directed to nanowire junctions.

Figure 6:
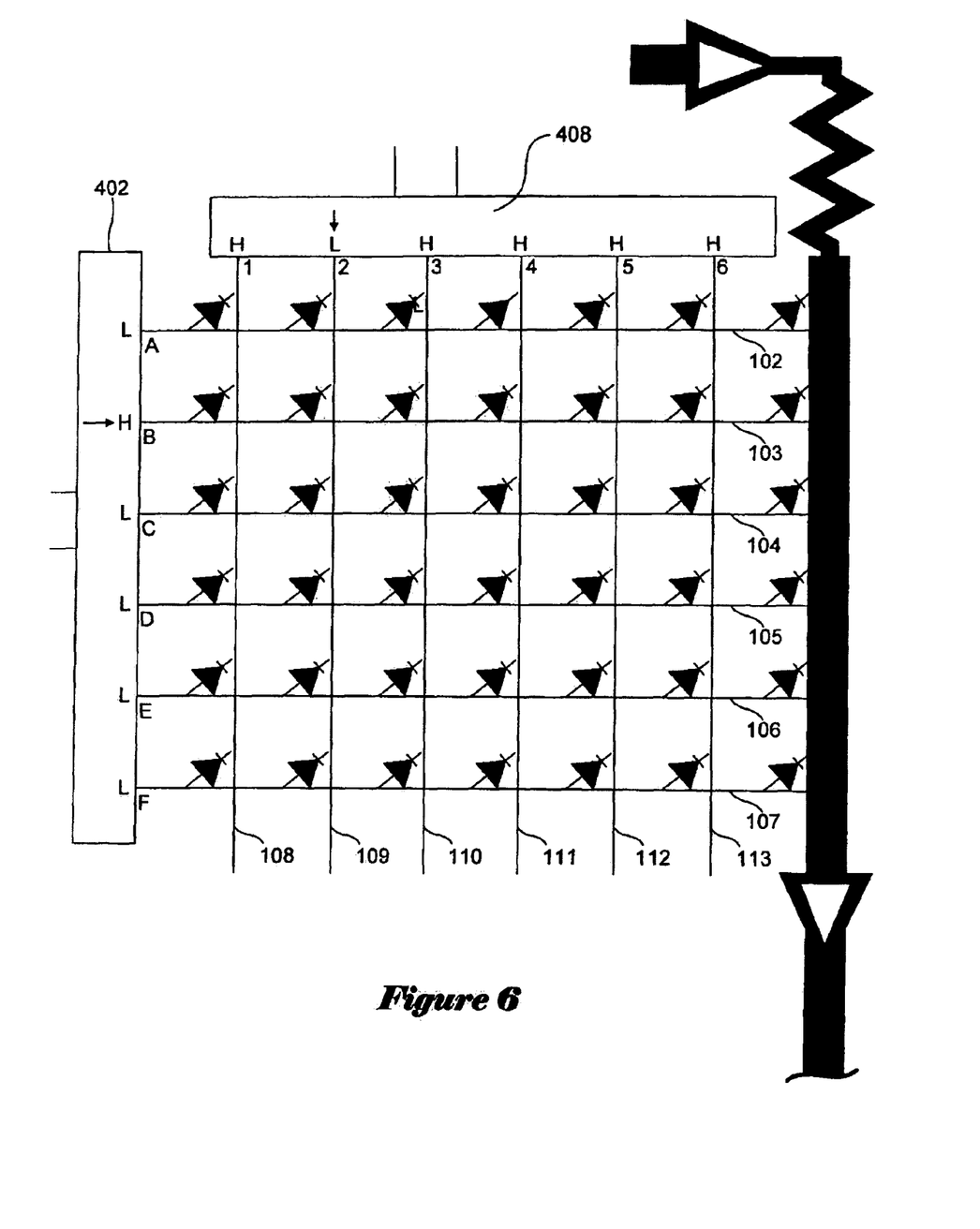
FIGS. 6-8 illustrate detection of the state of a particular nanowire junction within the nanowire-crossbar memory, including the microscale or submicroscale multiplexer wire, discussed above with reference to FIG. 5, which represents one embodiment of the present invention.
Figure 7:
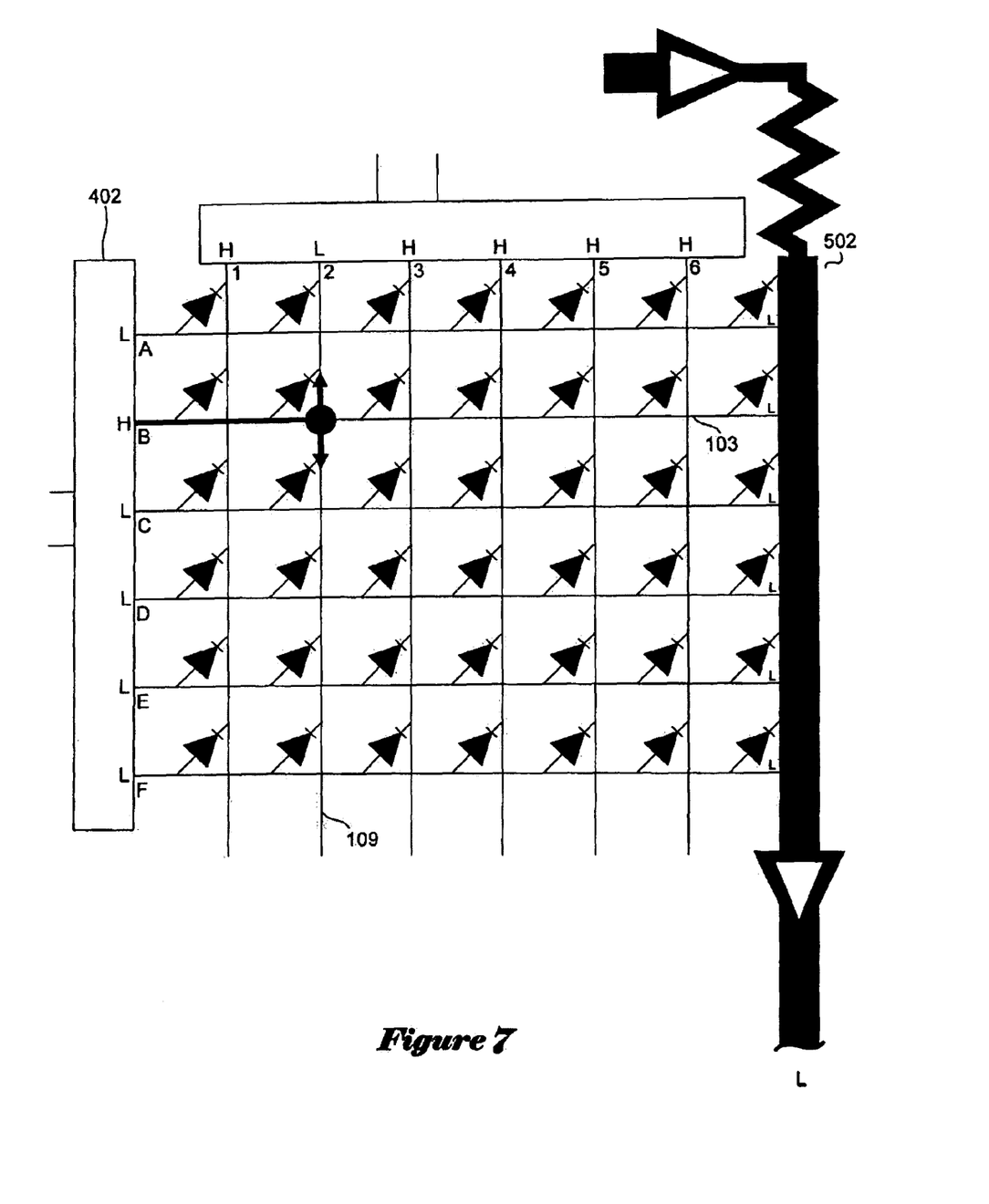
Figure 8:
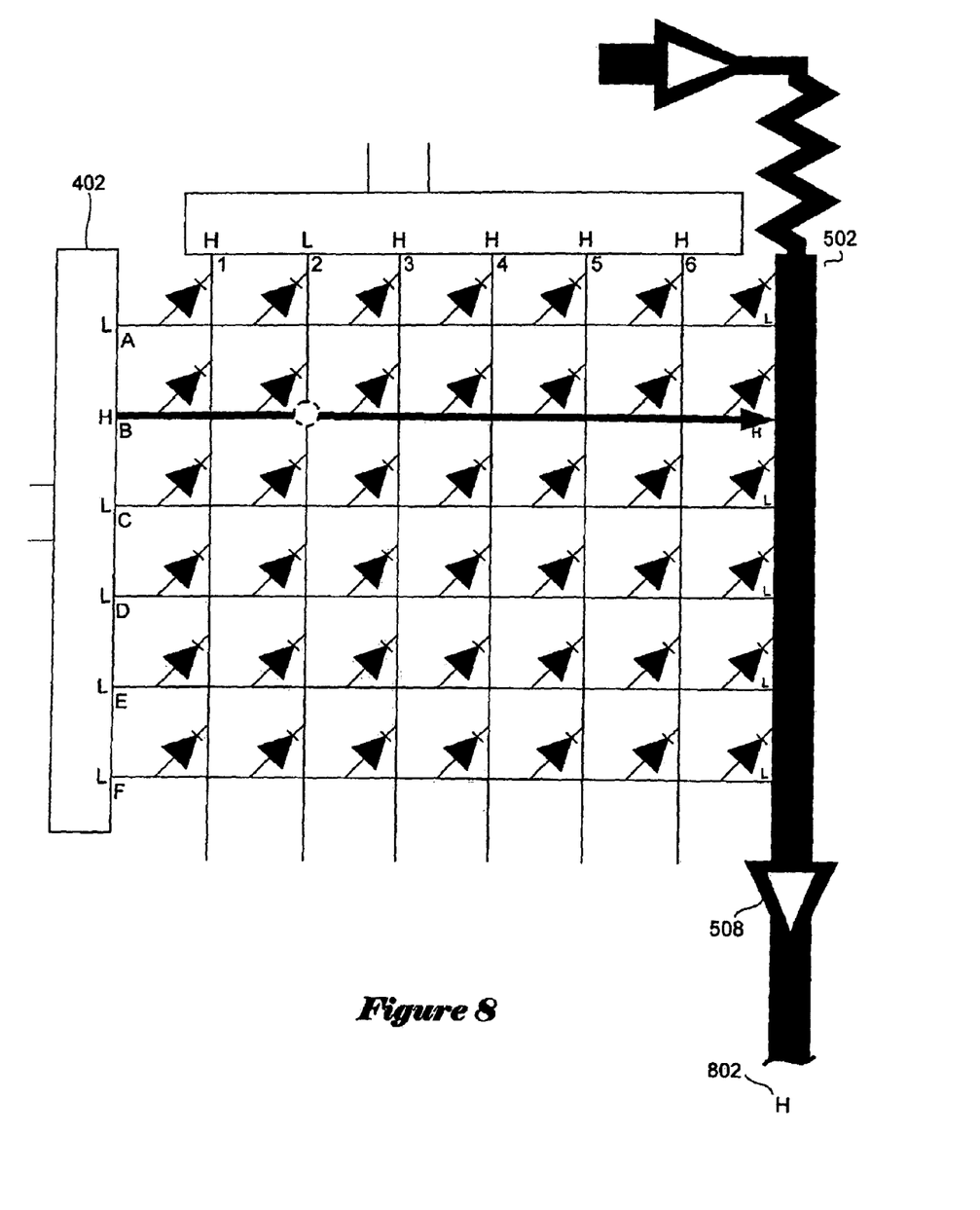

FIGS. 6-8 illustrate detection of the state of a particular nanowire junction within the nanowire-crossbar memory, including the multiplexer wire, as discussed above with reference to FIG. 5. In FIGS. 6-8, the controllable voltage source 506 is held at a low voltage or a ground, so that the multiplexer wire, absent voltage input from a horizontal nanowire, is in a low voltage or ground state. FIGS. 6-8 illustrate READ access operations directed to the nanowire junction at the nanowire intersection "B2." In order to access the nanowire junction at nanowire intersection "B2" 202, the vertical demultiplexer 402 outputs a moderately high, READ-access voltage $V_+$ to horizontal nanowire 103, while outputting relatively low or no voltage to the remaining horizontal nanowires 102 and 104-107. Concurrently, horizontal demultiplexer 408 outputs a moderately negative voltage $V_-$, or no voltage, to vertical nanowire 109, while outputting moderately high voltages to the remaining vertical nanowires 108 and 110-113. In general, in order to access a particular nanowire junction at grid point (i,j), the pattern of voltages output by vertical demultiplexer 402 is:

$$L_{0\,to\,i-1}, H_i, L_{i+1\,to\,n-1}$$

when $0<i<n$ $$H_0 L_{1\,to\,n-1}$$

when $i==0$; and $$L_{0\,to\,n-2}, H_{n-1}$$

when $i==n$
and the pattern of voltage outputs from horizontal demultiplexer 408 is:

$$H_{0\,to\,j-1}, L_j, H_{j+1\,to\,m-1}$$

when $0<j<m$ $$L_0 H_{i\,to\,m-1}$$

when $j==0$; and $$H_{0\,to\,m-2}, L_{m-1}$$

when $j==m-1$,
where there are n horizontal nanowires and m vertical nanowires in the nanowire crossbar. When the state of the nanowire junction is closed, with the voltage outputs from the two multiplexers as indicated in FIG. 6, then a relatively low-voltage or no voltage state obtains on the multiplexer wire 502, as shown in FIG. 7. In this case, horizontal nanowire 103 is essentially shorted by the low-voltage state on vertical nanowire 109, resulting in the high-voltage output by the vertical demultiplexer 402 to horizontal nanowire 103 being drawn to the low-voltage vertical nanowire 109 through the diode-like-acting nanowire junction, which passes current in the direction from the horizontal nanowire 103 to the vertical nanowire 109. Conversely, when the nanowire junction at intersection "B2" is in an open state, with the voltage outputs from the two multiplexers as indicated in FIG. 6, then, as shown in FIG. 8, the high-voltage applied by vertical multiplexer 402 to horizontal nanowire 103 results in a high voltage state at the multiplexer wire 502, amplified by the signal amplifier 508 to a resulting high-voltage state 802 differentiable, by microscale or sub-microscale electronics downstream from the signal amplifier, from the low-voltage state output in FIG. 7.

Figure 9:
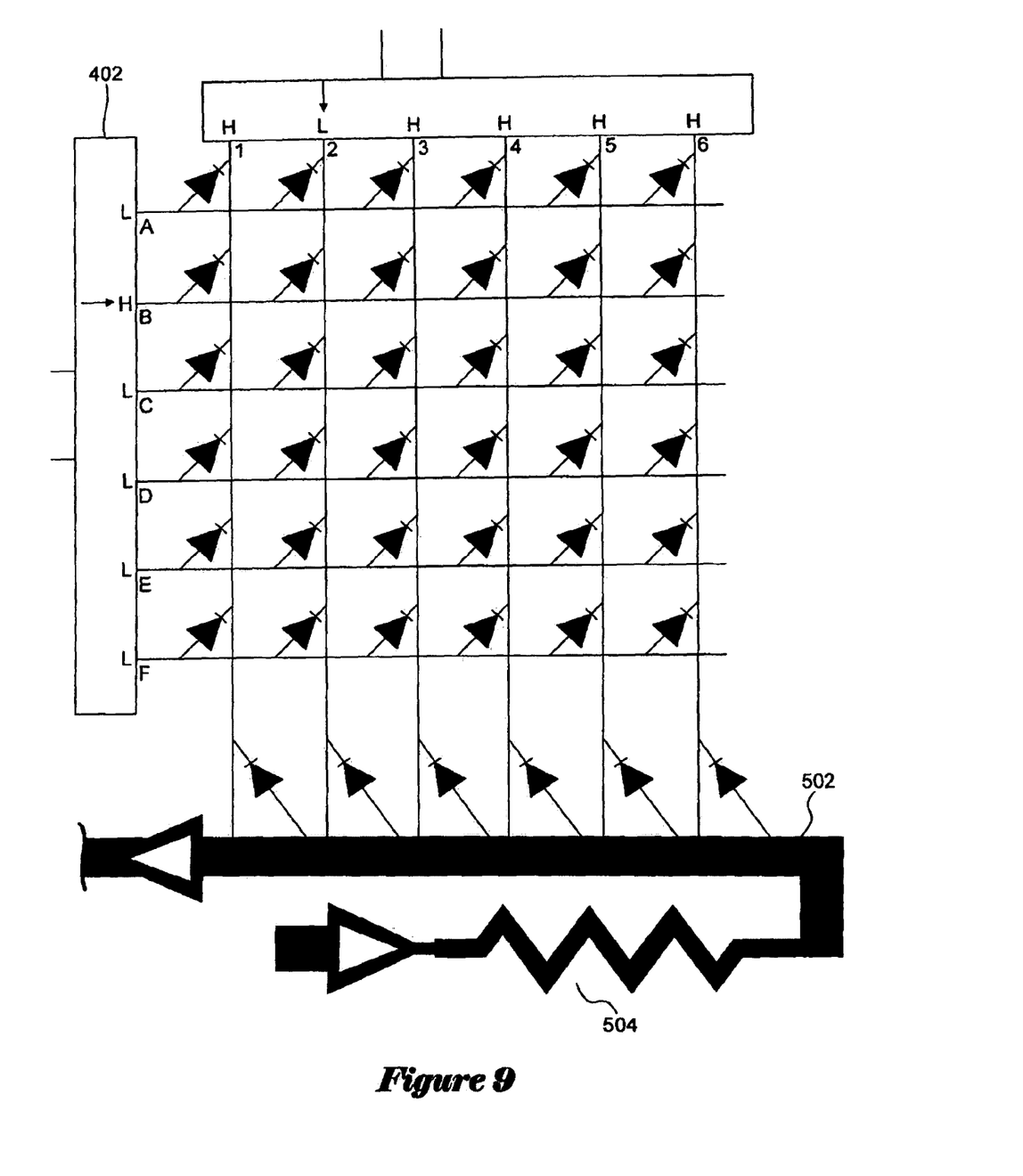
FIGS. 9-11 illustrate an alternative method for detection of the state of a particular nanowire junction within the nanowire-crossbar memory, including the microscale or submicroscale multiplexer wire, discussed above with reference to FIG. 5, which represents one embodiment of the present invention.
Figure 10:
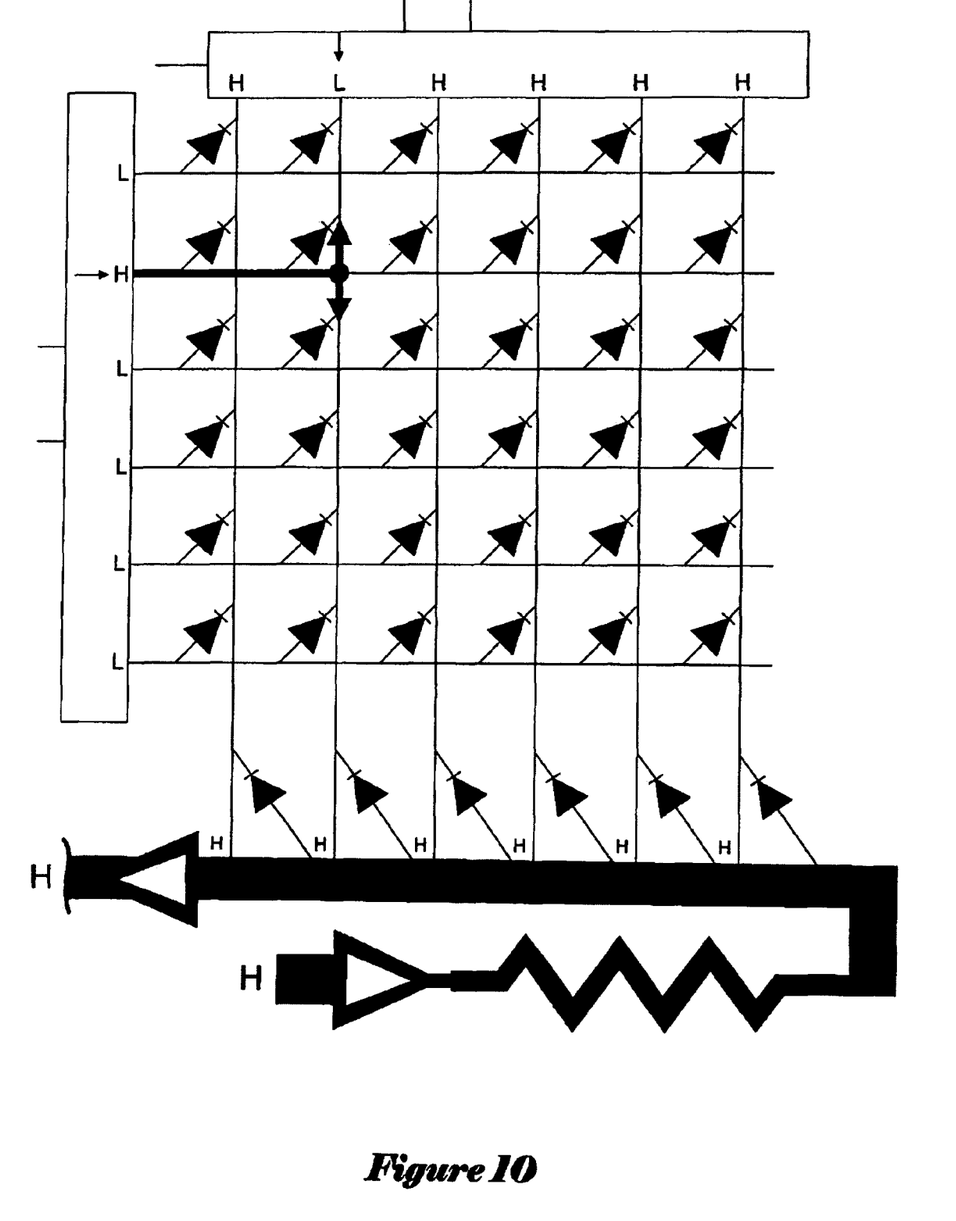
Figure 11:
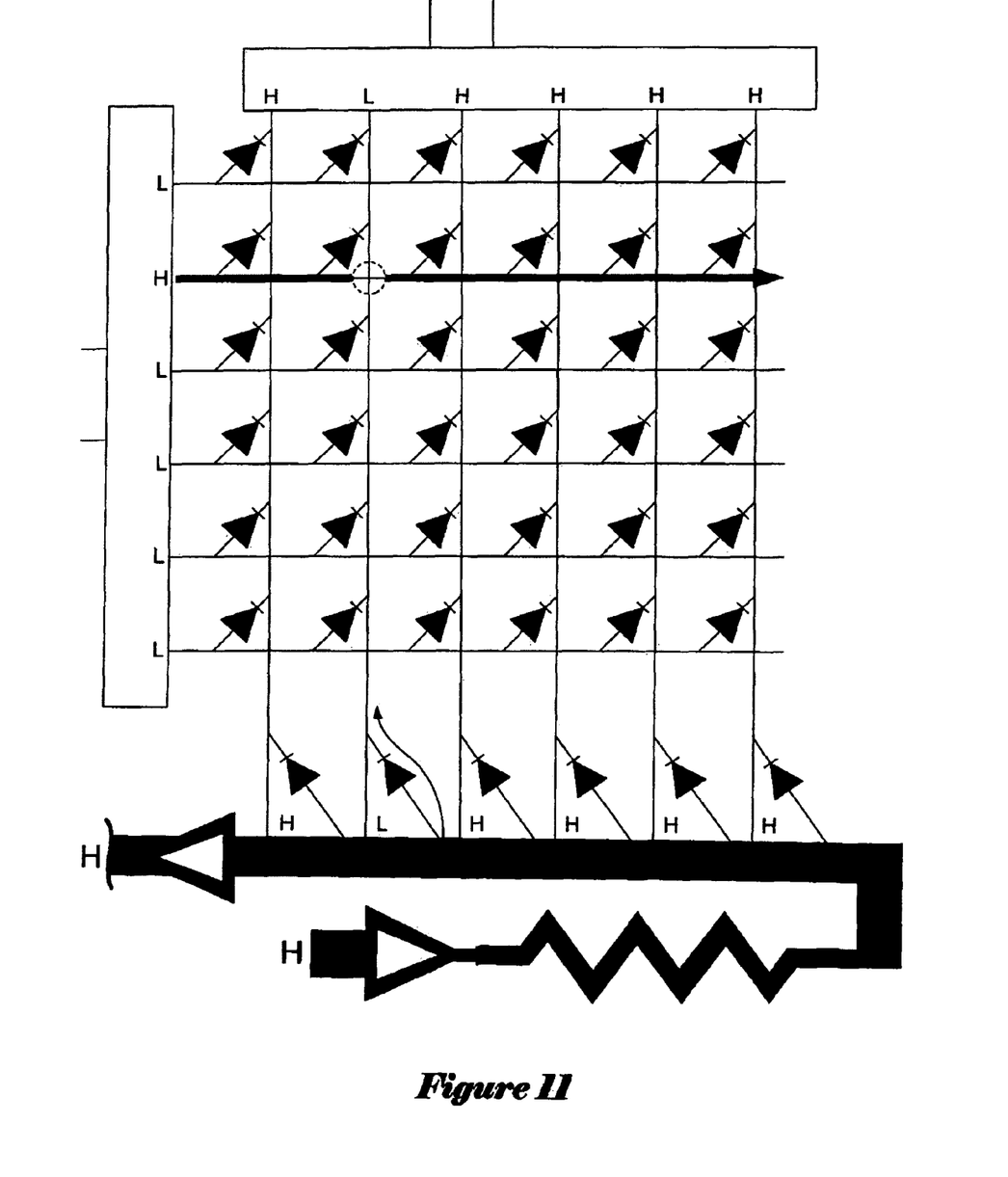

FIGS. 9-11 illustrate an alternative method for detection of the state of a particular nanowire junction within the nanowire-crossbar memory, including the microscale or submicroscale multiplexer wire, discussed above with reference to FIG. 5, which represents one embodiment of the present invention. As shown in FIG. 9, the multiplexer wire 502 can be alternatively interconnected with the vertical nanowires, and interconnected through the resistor 504 to a controllable voltage source 506 that outputs a relative high voltage to enable READ access to selected nanowire junction. The applied voltages and selected nanowire junction are the same in FIGS. 9-11 as in FIGS. 6-8. The alternative configuration shown in FIG. 9 results in a high voltage on the multiplexor wire in the case that the selected nanowire junction is closed, as shown in FIG. 10, and differentiably lower voltage when the selected nanowire junction is open, as shown in FIG. 11.

Although only six vertical and six horizontal nanowires are shown in the example nanowire-crossbar memory in FIGS. 5-11, the microscale or submiscroscale multiplexer wire that represents one embodiment of the present invention, discussed above with reference to FIGS. 5-8, can clearly be used to read the molecular-nanowire junction states of a nanowire-crossbar memory of arbitrary size. In essence, the microscale or submicroscale multiplexer wire, and the voltage inputs used on the two, orthogonally disposed demultiplexers in order to access a particular nanowire junction, provide an easily fabricated, economical, microscale or sub-microscale technique for accessing the states of individual nanowire junction within a nanowire crossbar. It should also be noted that, although in describing one embodiment, a technique for accessing a single nanowire junction is disclosed, above, different voltage output patterns of the two, orthogonally disposed demultiplexers may be used, in sequential operations, to access multiple memory elements concurrently. For example, and OR of all of the memory elements along a particular horizontal wire can be obtained by setting the voltage on that wire high, setting the voltage on all other horizontal nanowires low, and setting the voltage on all vertical nanowires low. An almost limitless number of similar, multi-memory-elements operations can be devised. It should also be noted that the phrase "orthogonally disposed demultiplexers" means that the demultiplexers output signals to two, roughly orthogonal sets of parallel nanowires, and not that the demultiplexers are physically positioned orthogonal to one another, although they may indeed be so positioned.

Although the present invention has been described in terms of a particular embodiment, it is not intended that the invention be limited to this embodiment. Modifications within the spirit of the invention will be apparent to those skilled in the art. For example, a microscale or sub-microscale multiplexer wire may be employed, along with orthogonally displaced demultiplexers, to access the states of individual nanowire-crossbar nanowire junction in a wide variety of different types of nanowire crossbars with different diode polarities, threshold transition voltages, access voltages, chemical compositions, and other differing characteristics. The microscale or submicroscale multiplexer wire may be held at any of many different convenient voltages from which a voltage generated on a single interconnected nanowire through closed nanowire junction along a nanowire can be differentiated by downstream electronics. In the disclosed embodiment, a signal amplifier is employed to amply the voltage state differences for downstream microelectronic or sub-microelectronic components. In alternate embodiments, a nanowire multiplexer embodiment may be employed without signal amplification in completely nanoscale implementations. In yet additional embodiments, the signal amplifier may not be needed, even at sub-microscale or microscale dimensions, depending on the sensitivity of downstream electronics. Although the described embodiment employs orthogonally disposed demultiplexers, any type of circuitry that enables selected patterns of low and moderately high voltages to be output to the horizontal and vertical nanowires of a nanowire crossbar may be used, in combination with a microscale, submicroscale, or nanoscale multiplexer wire in order to access the states of individual nanowire junction at nanowire intersections within the nanowire crossbar. While voltage levels and voltage signals are used in the described embodiment to read and write the nanowire-crossbar memory, current levels and signals may also be used.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A method for detecting a conductivity state of a nanowire junction at a nanowire intersection of nanowires i and j within a n×m nanowire crossbar, the method comprising:
   outputting to a selected one of nanowires i and j a first signal while outputting to the remaining nanowires parallel to the selected one of nanowires i and j, a second signal;
   outputting to the other of nanowires i and j the second signal while outputting to the remaining nanowires parallel to the other of nanowires i and j the first signal;
   when a first type of signal is detected on a multiplexer wire interconnected with the selected one of nanowires i and j and the remaining nanowires parallel to the selected one of nanowires i and j, determining the conductivity state of the nanowire junction at nanowire intersection of nanowires i and j to be in a first state; and
   when a second type of signal is detected on the multiplexer wire, determining the conductivity state of the nanowire junction at nanowire intersection of nanowires i and j to be in a second state;
   said method comprising applying a different voltage with a controllable voltage source to said multiplexer wire depending on whether a READ or WRITE operation is being performed on an element of said crossbar.

2. The method of claim 1 wherein the first signal is output to the selected one of nanowires i and j by a first demultiplexer.

3. The method of claim 2 wherein the second signal is output to the other of nanowires i and j by a second demultiplexer.

4. The method of claim 1 further including attaching the multiplexer wire to a signal amplifier to amplify the signal on the multiplexer-nanowire.

5. The method of claim 1 further including attaching the multiplexer wire to the controllable voltage source through a fixed resistive component.

6. A method for detecting a conductivity state of a nanowire junction at a nanowire intersection of nanowires i and j within a n×m nanowire crossbar, the method comprising:
   with a first demultiplexer, outputting to a selected one of nanowires i and j a first signal while outputting to the remaining nanowires parallel to the selected one of nanowires i and j, a second signal;
   with a second demultiplexer, outputting the second signal to the other of nanowires i and j, while outputting to at least one of the remaining nanowires parallel to the other of nanowires i and j, the second signal;
   when a first type of signal is detected on a multiplexer wire interconnected with a selected one of nanowires i and j and the remaining nanowires parallel to the selected one of nanowires i and j, determining the conductivity state of the nanowire junction at nanowire intersection of nanowires i and j to be in a first state; and
   when a second type of signal is detected on the multiplexer wire, determining the conductivity state of the nanowire junction at nanowire intersection of nanowires i and j to be in a second state;
   said method comprising applying a different voltage with a controllable voltage source to said multiplexer wire depending on whether a READ or WRITE operation is being performed on an element of said crossbar; and
   further including using different patterns of first and second output signals from the first and second demultiplexers in order to concurrently access multiple nanowire junctions.

7. The method of claim 6 further including using different patterns of first and second output signals from the first and second demultiplexers in a sequence of discrete operations in order to concurrently access multiple nanowire junction.

8. A nanowire-crossbar multiplexer comprising:
a n×m nanowire crossbar;
a microscale or submicroscale multiplexer wire interconnected with a first set of 1 through n approximately parallel nanowires of the nanowire crossbar; and
a controllable voltage source connected to a first end of said multiplexer wire, where said controllable voltage source applies a different voltage to said multiplexer wire depending on whether a READ or WRITE operation is being performed on an element of said crossbar.

9. The nanowire-crossbar multiplexer of claim 8 wherein the conductivity state of a nanowire junction at a nanowire intersection of nanowires i and j within the n×m nanowire crossbar is determined by
applying to nanowire i a first signal while applying to the remaining n−1 nanowires parallel to the selected one of nanowires i and j a second signal;
applying to nanowire j the second signal while applying to the remaining m−1 nanowires parallel to nanowire j the first signal;
when a signal on the multiplexer wire is of a first type, determining the conductivity state of the nanowire junction at nanowire intersection of nanowires i and j to be in a first state; and
when the signal on the multiplexer wire is of a second type, determining the conductivity state of the nanowire junction at nanowire intersection of nanowires i and j to be in a second state.

10. The nanowire-crossbar multiplexer of claim 8 further including:
a first demultiplexer that outputs signals to the n approximately parallel nanowires; and
a second demultiplexer that outputs signals to the m approximately parallel nanowires.

11. The nanowire-crossbar multiplexer of claim 8 wherein multiple nanowire junction are concurrently accessed by outputting different patterns of first and second signals from the first and second demultiplexers and determining a resulting signal or signals output to the multiplexer wire.

12. The nanowire-crossbar multiplexer of claim 8 further including a signal amplifier attached to a second end of the multiplexer wire.

13. The nanowire-crossbar multiplexer of claim 8 further including a fixed resistive component attached to said first end of the multiplexer-wire between said controllable voltage source and said multiplexer wire.

14. A method of operating a nanowire-crossbar multiplexer comprising:
a n×m nanowire crossbar;
a microscale or submicroscale multiplexer wire interconnected with a first set of 1 through n approximately parallel nanowires of the nanowire crossbar; and
a controllable voltage source connected to a first end of said multiplexer wire;
said method comprising applying a different voltage with said controllable voltage source to said multiplexer wire depending on whether a READ or WRITE operation is being performed on an element of said crossbar.

15. The method of claim 14, wherein the conductivity state of a nanowire junction at a nanowire intersection of nanowires i and j within the n×m nanowire crossbar is determined by
applying to nanowire i a first signal while applying to the remaining n−1 nanowires parallel to the selected one of nanowires i and j a second signal;
applying to nanowire j the second signal while applying to the remaining m−1 nanowires parallel to nanowire j the first signal;
when a signal on the multiplexer wire is of a first type, determining the conductivity state of the nanowire junction at nanowire intersection of nanowires i and j to be in a first state; and
when the signal on the multiplexer wire is of a second type, determining the conductivity state of the nanowire junction at nanowire intersection of nanowires i and j to be in a second state.

16. The method of claim 15, wherein the first signal is output to the selected one of nanowires i and j by a first demultiplexer.

17. The method of claim 16, wherein the second signal is output to the other of nanowires i and j by a second demultiplexer.

18. The method of claim 14, amplifying a signal on said multiplexer wire with a signal amplifier connected at an end of said multiplexer wire.

* * * * *